US008802027B2

(12) United States Patent  
Abate et al.

(10) Patent No.: US 8,802,027 B2
(45) Date of Patent: Aug. 12, 2014

(54) SURFACES, INCLUDING MICROFLUIDIC CHANNELS, WITH CONTROLLED WETTING PROPERTIES

(75) Inventors: Adam R. Abate, San Francisco, CA (US); Amber T. Krummel, Somerville, MA (US); Christian Holtze, Frankfurt (DE); David A. Weitz, Bolton, MA (US)

(73) Assignees: President and Fellows of Harvard College, Cambridge, MA (US); BASF SE, Ludwigshafen (DE)

( * ) Notice: Subject to any disclaimer, the term of this patent is extended or adjusted under 35 U.S.C. 154(b) by 615 days.

(21) Appl. No.: 12/935,203

(22) PCT Filed: Feb. 11, 2009

(86) PCT No.: PCT/US2009/000850
§ 371 (c)(1),
(2), (4) Date: Dec. 13, 2010

(87) PCT Pub. No.: WO2009/120254
PCT Pub. Date: Oct. 1, 2009

(65) Prior Publication Data
US 2011/0123413 A1    May 26, 2011

Related U.S. Application Data

(60) Provisional application No. 61/040,442, filed on Mar. 28, 2008.

(51) Int. Cl.
*B01L 99/00*    (2010.01)
(52) U.S. Cl.
USPC .......................................................... 422/502
(58) Field of Classification Search
USPC ................................................. 422/502, 503
See application file for complete search history.

(56) References Cited

U.S. PATENT DOCUMENTS

| | | | |
|---|---|---|---|
| 5,512,131 A | 4/1996 | Kumar et al. | |
| 5,948,484 A | 9/1999 | Gudimenko et al. | |
| 6,355,198 B1 | 3/2002 | Kim et al. | |
| 6,426,371 B1 | 7/2002 | Li et al. | |
| 6,576,478 B1 | 6/2003 | Wagner et al. | |
| 7,431,889 B2 | 10/2008 | Engstrom et al. | |
| 7,776,927 B2 | 8/2010 | Chu et al. | |
| 8,084,085 B2 | 12/2011 | Remy | |
| 2003/0104466 A1 | 6/2003 | Knapp et al. | |
| 2004/0028566 A1* | 2/2004 | Ko et al. | 422/100 |
| 2005/0127002 A1* | 6/2005 | Zare et al. | 210/656 |
| 2005/0172476 A1 | 8/2005 | Stone et al. | |
| 2005/0233899 A1* | 10/2005 | Anzaki et al. | 502/350 |
| 2006/0088666 A1 | 4/2006 | Kobrin et al. | |
| 2006/0163385 A1 | 7/2006 | Link et al. | |
| 2006/0166537 A1 | 7/2006 | Thompson et al. | |
| 2006/0171990 A1* | 8/2006 | Asgari | 424/426 |
| 2007/0000342 A1 | 1/2007 | Kazuno | |
| 2007/0005024 A1 | 1/2007 | Weber et al. | |
| 2007/0054119 A1 | 3/2007 | Garstecki et al. | |
| 2007/0224082 A1* | 9/2007 | Ogawa | 422/58 |
| 2009/0012187 A1 | 1/2009 | Chu et al. | |
| 2010/0239824 A1 | 9/2010 | Weitz et al. | |

FOREIGN PATENT DOCUMENTS

| | | |
|---|---|---|
| EP | 1164207 A2 | 12/2001 |
| JP | 2003-136500 | 5/2003 |
| JP | 2003-230829 | 8/2003 |
| JP | 2004-125475 | 4/2005 |
| JP | 2005-103423 | 4/2005 |
| JP | 2005-519264 A | 6/2005 |
| JP | 2005-331286 | 12/2005 |
| JP | 2007-538226 | 12/2007 |
| JP | 2008-530317 | 8/2008 |
| JP | 2008-284626 | 11/2008 |
| KR | 2006-0049351 A | 5/2006 |
| WO | WO 96/29629 A2 | 9/1996 |
| WO | WO 01/89787 A2 | 11/2001 |
| WO | WO 03/072831 | 9/2003 |

(Continued)

OTHER PUBLICATIONS

International Search Report from PCT/US2009/000850, mailed May 29, 2009.

(Continued)

*Primary Examiner* — Paul Hyun
(74) *Attorney, Agent, or Firm* — Wolf, Greenfield & Sacks, P.C.

(57) ABSTRACT

The present invention generally relates to coating materials, including photoactive coating materials. In some aspects of the invention, a sol-gel is provided that can be formed as a coating on a microfluidic channel. One or more portions of the sol-gel can be reacted to alter its hydrophobicity, in some cases. For instance, in one set of embodiments, a portion of the sol-gel may be exposed to light, such as ultraviolet light, which can be used to induce a chemical reaction in the sol-gel that alters its hydrophobicity. In one set of embodiments, the sol-gel can include a photoinitiator, that upon exposure to light, produces radicals. Optionally, the photoinitiator may be conjugated to a silane or other material within the sol-gel. The radicals so produced may be used to cause a polymerization reaction to occur on the surface of the sol-gel, thus altering the hydrophobicity of the surface. In some cases, various portions may be reacted or left unreacted, e.g., by controlling exposure to light (for instance, using a mask). Such treated surfaces within a microfluidic channel may be useful in a wide variety of applications, for instance, in the creation of emulsions such as multiple emulsions.

33 Claims, 4 Drawing Sheets

(56) References Cited

FOREIGN PATENT DOCUMENTS

| WO | WO 03/104774 A1 | 12/2003 |
|---|---|---|
| WO | WO 2004/081536 A2 | 9/2004 |
| WO | WO 2005/001121 A1 | 1/2005 |
| WO | WO 2006/027757 A2 | 3/2006 |
| WO | WO 2006/086841 A1 | 8/2006 |
| WO | WO 2006/096571 A2 | 9/2006 |
| WO | WO 2008/121342 A2 | 10/2008 |
| WO | WO 2009/120254 | 10/2009 |

OTHER PUBLICATIONS

International Search Report and Written Opinion for PCT/US2008/009477, mailed Jun. 24, 2009.
Abate, A. et al., "Glass coating for PDMS microfluidic channels by sol-gel methods", *Lab on a Chip*, vol. 8, pp. 516-518 (2008).
Angell, J., et al., "Silicon Micromechanical Devices," *Scientific American*, vol. 248, pp. 44-55 (1983).
Arkles, B. et al. "Tailoring surfaces with silanes", Chemtech Dec. 1977, 766-778.
Duffy, D., et al., "Rapid Prototyping of Microfluidic Systems in Poly(dimethylsiloxane)", Anal. Chem., vol. 70, pp. 4974-4984 (1998).
Fiorini, G. et al. "Fabrication of thermoset polyster microfluidic devices and embossing masters using rapid prototyped polydimethylsiloxane molds" *Lab on a Chip*, vol. 3, pp. 158-163 (2003).
Kelly, et al., "Thermal Bonding of Polymeric Capillary Electrophoresis Microdevices in Water," Anal. Chem., vol. 75, No. 8, pp. 1941-1945 (2003).
Li, et al., "The Impact of Ultraviolet Light on Bacterial Adhesion to Glass and Metal Oxide-Coated Surface." *Colloids and Surfaces B: Biointerfaces*, 41, pp. 153-161 (2005).
Lee, et al., "All-Nanoparticle Thin-Film Coatings," Nano Letters, vol. 6, No. 10, pp. 2305-12312 (2006).
Parashar, V. et al. "The Sol-Gel Process for Realisation of Optical Micro-Structures in Glass" Key Engineering Materials, vols. 264-268, pp. 371-374 (2004).
Roman, et al., "Sol-Gel Modified Poly(dimethylsiloxane) Microfluidic Devices with High Electroosmotic Mobilities and Hydrophilic Channel Wall Characteristics," Anal. Chem., vol. 77, No. 5, pp. 1414-1422 (2005).
Roman, et al. "Surface Engineering of Poly(dimethylsiloxane) Microfluidic Devices Using Transition Metal Sol-Gel Chemistry" Langmuir, vol. 22, No. 9, pp. 4445-4451 (2006).
Sakai, Y. et al. "Silica coating on plastics by liquid phase deposition (LPD) method" Thin Solid Films, vol. 392, pp. 294-298 (2001).
Soppera, et al. "Optimization of Radical Photopolymerization in Hybrid Sol-Gel Glasses: Advantages of Biocomponent Photoactive Systems," *Mat Res Soc Symp Proc.*, vol. 726. (2002).
Vickers, J. et al. "Generation of Hydrophilic Poly(dimethylsiloxane) for High-Performance Microchip Electrophoresis" Anal. Chem., vol. 78, No. 21, pp. 7446-7452 (2006).
Xia, Y. et al., "Soft Lithography," Annu. Rev. Mater. Sci., vol. 28, pp. 153-184 (1998).
Wang, W. et al., "Modification of poly(dimethylsiloxane) microfluidic channels with silica nanoparticles based on layer-by-layer assembly technique," *Journal of Chromatography, A*, 1136 (1), pp. 111-117 (2006).
Yoshida, et al. "Preparation and Water Droplet Sliding Properties of Transparent Hydrophobic Polymer Coating by Molecular Design for Self-Organization." *Journal of Sol-Gel Science and Technology*, 31, pp. 195-199 (2004).
International Preliminary Report on Patentability for PCT/US2009/000850 mailed Oct. 7, 2010.
International Preliminary Report on Patentability for PCT Application PCT/US2008/009477 mailed Feb. 18, 2010.
Office Action for U.S. Appl. No. 12/733,086 mailed Oct. 12, 2012.
Lee et al., Synthetic control of molecular weight and microstructure of processible poly(methylsilsesquioxane)s for low-dielectric thin film applications. Polymer. Oct. 2001;42(21):9085-89.
Japanese Office Action for Application No. JP 2011-501785 mailed Jun. 25, 2013.
Office Action for U.S. Appl. No. 12/733,086 mailed May 2, 2013.
Office Action for U.S. Appl. No. 12/733,086 mailed Sep. 23, 2013.
Japanese Office Action for Application No. JP 2011-501785 mailed Mar. 26, 2014.

\* cited by examiner

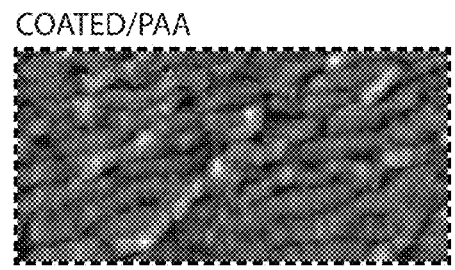
Fig. 3A  Fig. 3B
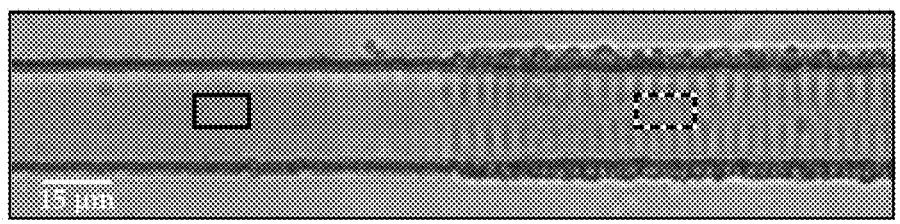
Fig. 3C
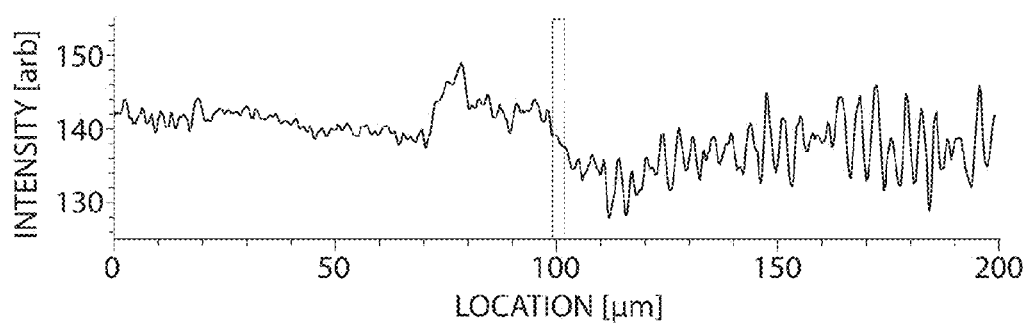
Fig. 3D

SURFACES, INCLUDING MICROFLUIDIC CHANNELS, WITH CONTROLLED WETTING PROPERTIES

RELATED APPLICATIONS

This application is a national stage entry of International Patent Application No. PCT/US2009/000850, filed Feb. 11, 2009, and entitled "Surfaces, Including Microfluidic Channels, With Controlled Wetting Properties," which claims the benefit of U.S. Provisional Patent Application Ser. No. 61/040,442, filed Mar. 28, 2008, entitled "Surfaces, Including Microfluidic Channels, With Controlled Wetting Properties," by Abate, et al., each of which is incorporated herein by reference.

GOVERNMENT FUNDING

This invention was made with government support under DMR-0602684, DMR-02313805 and DMR-0649865 awarded by National Science Foundation. The government has certain rights in the invention.

FIELD OF INVENTION

The present invention generally relates to coating materials, including photoactive coating materials.

BACKGROUND

Glass-capillary microfluidic devices have recently enabled formation of highly monodisperse emulsions with a rich array of droplet morphologies, such as those disclosed in U.S. Provisional Patent Application Ser. No. 60/920,574, filed Mar. 28, 2007, entitled "Multiple Emulsions and Techniques for Formation," by Chu, et al., incorporated herein by reference. Such devices exhibit chemical robustness and precise control.

An emulsion is a fluidic state which exists when a first fluid is dispersed in a second fluid that is typically immiscible or substantially immiscible with the first fluid. Examples of common emulsions are oil in water and water in oil emulsions. Multiple emulsions are emulsions that are formed with more than two fluids, or two or more fluids arranged in a more complex manner than a typical two-fluid emulsion. For example, a multiple emulsion may be oil-in-water-in-oil ("o/w/o"), or water-in-oil-in-water ("w/o/w"). Multiple emulsions are of particular interest because of current and potential applications in fields such as pharmaceutical delivery, paints and coatings, food and beverage, chemical separations, and health and beauty aids.

SUMMARY OF THE INVENTION

The present invention generally relates to coating materials, including photoactive coating materials. The subject matter of the present invention involves, in some cases, interrelated products, alternative solutions to a particular problem, and/or a plurality of different uses of one or more systems and/or articles.

In one aspect, the invention is directed to an article. In one set of embodiments, the article includes a sol-gel coating coated on at least a portion of a microfluidic channel. In another set of embodiments, the article includes a sol-gel coating coated on at least a portion of a substrate.

The invention, in another aspect, is directed to a method. In one set of embodiments, the method includes acts of exposing at least a portion of a microfluidic channel to a sol, causing at least a portion of the sol to gel within the microfluidic channel to form a sol-gel coating, and altering the hydrophobicity of a first portion of the sol-gel coating without altering the hydrophobicity of a second portion of the sol-gel coating.

In yet another aspect, the invention is directed to a composition. In one set of embodiments, the composition includes a photoinitiator coupled to a silane.

In another aspect, the present invention is directed to a method of making one or more of the embodiments described herein, for example, photoactive coating materials such as those described herein. In another aspect, the present invention is directed to a method of using one or more of the embodiments described herein, for example, photoactive coating materials such as those described herein.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 3A-3D illustrate AFM images of a coated microfluidic channel, in yet another embodiment of the invention.

DETAILED DESCRIPTION

Figure 1E:
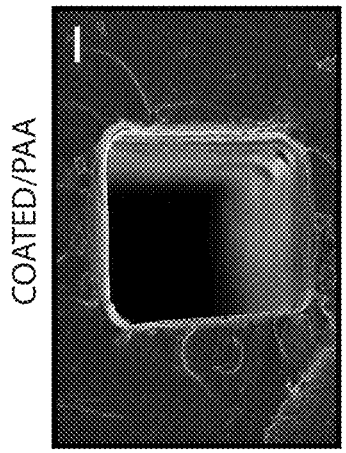
FIGS. 1A-1F illustrate various coated microfluidic channels, according to various embodiments of the invention.

The present invention generally relates to coating materials, including photoactive coating materials. In some aspects of the invention, a sol-gel is provided that can be formed as a coating on a substrate such as a microfluidic channel. One or more portions of the sol-gel can be reacted to alter its hydrophobicity, in some cases. For example, a portion of the sol-gel may be exposed to light, such as ultraviolet light, which can be used to induce a chemical reaction in the sol-gel that alters its hydrophobicity. The sol-gel can include a photoinitiator which, upon exposure to light, produces radicals. Optionally, the photoinitiator may be conjugated to a silane or other material within the sol-gel. The radicals so produced may be used to cause a condensation or polymerization reaction to occur on the surface of the sol-gel, thus altering the hydrophobicity of the surface. In some cases, various portions may be reacted or left unreacted, e.g., by controlling exposure to light (for instance, using a mask). Such treated surfaces within a microfluidic channel may be useful in a wide variety of applications, for instance, in the creation of emulsions such as multiple emulsions, for instance, as discussed in U.S. patent application Ser. No. 12/058,628, filed on Mar. 28, 2008, entitled "Emulsions and Techniques for Formation," by Chu, et al.

The invention is described herein primarily in the context of coatings on microfluidic channels, coatings of particular hydrophobicity (lipophilicity) or hydrophobicity (lipophilicity), controlling hydrophobicity, coatings of particular thicknesses, etc. In some cases, fluorophilicity may be controlled, in addition to or instead of hydrophobicity. It is to be understood that any of the various aspects and options of the invention can be present, absent, and/or used alone or in combination with any other aspects, option, example, or embodiment. For example, in one embodiment, more than layer of sol may be applied to a surface, or a photoinitiator may be applied after the treatment with another sol-gel mixture.

In one aspect of the invention, a sol-gel is coated onto at least a portion of a substrate. As is known to those of ordinary skill in the art, a sol-gel is a material that can be in a sol or a gel state. In some cases, the solgel material may comprise a polymer. The sol state may be converted into the gel state by chemical reaction. In some cases, the reaction may be facilitated by removing solvent from the sol, e.g., via drying or heating techniques. Thus, in some cases, as discussed below, the sol may be pretreated before being used, for instance, by causing some condensation to occur within the sol. Sol-gel chemistry is, in general, analogous to polymerization, but is a sequence of hydrolysis of the silanes yielding silanols and subsequent condensation of these silanols to form silica or siloxanes.

In some embodiments, the sol-gel coating may be chosen to have certain properties, for example, having a certain hydrophobicity. The properties of the coating may be controlled by controlling the composition of the sol-gel (for example, by using certain materials or polymers within the sol-gel), and/or by modifying the coating, for instance, by exposing the coating to a condensation or polymerization reaction to react a polymer to the sol-gel coating, as discussed below.

For example, the sol-gel coating may be made more hydrophobic by incorporating a hydrophobic polymer in the sol-gel. For instance, the sol-gel may contain one or more silanes, for example, a fluorosilane (i.e., a silane containing at least one fluorine atom) such as heptadecafluorosilane or heptadecafluorooctylsilane, or other silanes such as methyltriethoxy silane (MTES) or a silane containing one or more lipid chains, such as octadecylsilane or other $CH_3(CH_2)_n$-silanes, where n can be any suitable integer. For instance, n may be greater than 1, 5, or 10, and less than about 20, 25, or 30. The silanes may also optionally include other groups, such as alkoxide groups, for instance, octadecyltrimethoxysilane. Other examples of suitable silanes include alkoxysilanes such as ethoxysilane or methoxysilane, halosilanes such as chlorosilanes, or other silicon-containing compounds containing hydrolyzable moieties on the silicon atom, such as hydroxide moieties. In general, most silanes can be used in the sol-gel, with the particular silane being chosen on the basis of desired properties such as hydrophobicity. Other silanes (e.g., having shorter or longer chain lengths) may also be chosen in other embodiments of the invention, depending on factors such as the relative hydrophobicity or hydrophilicity desired. In some cases, the silanes may contain other groups, for example, groups such as amines, which would make the sol-gel more hydrophilic. Non-limiting examples include diamine silane, triamine silane, or N-[3-(trimethoxysilyl)propyl] ethylene diamine silane. The silanes may be reacted to form networks within the sol-gel, and the degree of condensation may be controlled by controlling the reaction conditions, for example by controlling the temperature, amount of acid or base present, or the like. In some cases, more than one silane may be present in the sol-gel. For instance, the sol-gel may include fluorosilanes to cause the resulting sol-gel to exhibit greater hydrophobicity, and other silanes (or other compounds) that facilitate the production of polymers. In some cases, materials able to produce $SiO_2$ compounds to facilitate condensation or polymerization may be present, for example, TEOS (tetraethyl orthosilicate). In some embodiments, the silane may have up to four chemical moieties bonded to it, and in some cases, one of the moieties may be on RO-moiety, where R is an alkoxide or other chemical moieity, for example, so that the silane can become incorporated into a metal oxide-based network. In addition, in some cases, one or more of the silanes may be hydrolyzed to form the corresponding silanol.

In addition, it should be understood that the sol-gel is not limited to containing only silanes, and other materials may be present in addition to, or in place of, the silanes. For instance, the coating may include one or more metal oxides, such as $SiO_2$, vanadia ($V_2O_5$), titania ($TiO_2$), and/or alumina ($Al_2O_3$). As other examples, the sol-gel may comprise moieties containing double bonds, or otherwise are reactive within any polymerization reactions, for example, thiols for participation in radical polymerization.

The substrate may be any suitable material able to receive the sol-gel, for example, glass, metal oxides, or polymers such as polydimethylsiloxane (PDMS) and other siloxane polymers. In some cases, the substrate may be one in which contains silicon atoms, and in certain instances, the substrate may be chosen such that it contains silanol (Si—OH) groups, or can be modified to have silanol groups. For instance, the substrate may be exposed to an oxygen plasma, an oxidant, or a strong acid or a strong base cause the formation of silanol groups on the substrate. The substrate may have any suitable shape, for example, a flat surface, a microfluidic channel, etc.

The sol-gel may be present as a coating on the substrate, and the coating may have any suitable thickness. For instance, the coating may have a thickness of no more than about 100 micrometers, no more than about 30 micrometers, no more than about 10 micrometers, no more than about 3 micrometers, or no more than about 1 micrometer. Thicker coatings may be desirable in some cases, for instance, in applications in which higher chemical resistance is desired. However, thinner coatings may be desirable in other applications, for instance, within relatively small microfluidic channels.

In one set of embodiments, the hydrophobicity of the sol-gel coating can be controlled, for instance, such that a first portion of the sol-gel coating is relatively hydrophobic, and a second portion of the sol-gel coating is more or less relatively hydrophobic than the first portion. The hydrophobicity of the coating can be determined using techniques known to those of ordinary skill in the art, for example, using contact angle measurements such as those discussed below. For instance, in some cases, a first portion of a substrate (e.g., within a microfluidic channel) may have a hydrophobicity that favors an organic solvent to water, while a second portion may have a hydrophobicity that favors water to the organic solvent.

The hydrophobicity of the sol-gel coating can be modified, for instance, by exposing at least a portion of the sol-gel coating to a condensation or polymerization reaction to react a polymer to the sol-gel coating. The polymer reacted to the sol-gel coating may be any suitable polymer, and may be chosen to have certain hydrophobicity properties. For instance, the polymer may be chosen to be more hydrophobic or more hydrophilic than the substrate and/or the sol-gel coating. As an example, a hydrophilic polymer that could be used is poly(acrylic acid).

The polymer may be added to the sol-gel coating by supplying the polymer in monomeric (or oligomeric) form to the sol-gel coating (e.g., in solution), and causing a condensation or polymerization reaction to occur between the polymer and the sol-gel. For instance, free radical polymerization may be used to cause bonding of the polymer to the sol-gel coating. In some embodiments, a reaction such as free radical polymerization may be initiated by exposing the reactants to heat and/or light, such as ultraviolet (UV) light, optionally in the presence of a photoinitiator able to produce free radicals (e.g., via molecular cleavage) upon exposure to light. Those of ordinary skill in the art will be aware of many such photoinitiators, many of which are commercially available, such as Irgacure 2959 (Ciba Specialty Chemicals), aminobenzophenone, benzophenone, or 2-hydroxy-4-(3-triethoxysilylpropoxy)-diphenylketone (SIH6200.0, ABCR GmbH & Co. KG).

The photoinitiator may be included with the polymer added to the sol-gel coating, or in some cases, the photoinitiator may be present within the sol-gel coating. The photoinitiators may also be introduced within the sol-gel coating after the coating step, in some cases. As an example, a photoinitiator may be contained within the sol-gel coating, and activated upon exposure to light. The photoinitiator may also be conjugated or bonded to a component of the sol-gel coating, for example, to a silane. As an example, a photoinitiator such as Irgacure 2959 may be conjugated to a silane-isocyanate via a urethane bond (where a primary alcohol on the photoinitiator may participate in nucleophilic addition with the isocyanate group, which may produce a urethane bond).

It should be noted that only a portion of the sol-gel coating may be reacted with a polymer, in some embodiments of the invention. For instance, the monomer and/or the photoinitiator may be exposed to only a portion of the substrate, or the condensation or polymerization reaction may be initiated in only a portion of the substrate. As a particular example, a portion of the substrate may be exposed to light, while other portions are prevented from being exposed to light, for instance, by the use of masks or filters. Accordingly, different portions of the substrate may exhibit different hydrophobicities, as condensation or polymerization does not occur everywhere on the substrate. As another example, the substrate may be exposed to UV light by projecting a de-magnified image of an exposure pattern onto the substrate. In some cases, small resolutions (e.g., 1 micrometer, or less) may be achieved by projection techniques.

Another aspect of the present invention is generally directed at systems and methods for coating such a sol-gel onto at least a portion of a substrate. It should be understood in the descriptions below, however, that for a sol-gel that is coated "on" at least a portion of the substrate, at least some of the sol-gel may become embedded within the substrate, e.g., as certain silanes may be able to diffuse into PDMS. In fact, such diffusion may facilitate the coating and positioning of the sol-gel onto the substrate.

In one set of embodiments, a substrate, such as a microfluidic channel, is exposed to a sol, which is then treated to form a sol-gel coating. In some cases, the sol can also be pretreated to cause partial condensation or polymerization to occur. Extra sol-gel coating may optionally be removed from the substrate. In some cases, as discussed, a portion of the coating may be treated to alter its hydrophobicity (or other properties), for instance, by exposing the coating to a solution containing a monomer and/or an oligomer, and causing condensation or polymerization of the monomer and/or oligomer to occur with the coating.

The sol may be contained within a solvent, which can also contain other compounds such as photoinitiators including those described above. In some cases, the sol may also comprise one or more silane compounds. The sol may be treated to form a gel using any suitable technique, for example, by removing the solvent using chemical or physical techniques, such as heat. For instance, the sol may be exposed to a temperature of at least about 50° C., at least about 100° C., at least about 150° C., at least about 200° C., or at least about 250° C., which may be used to drive off or vaporize at least some of the solvent. As a specific example, the sol may be exposed to a hotplate set to reach a temperature of at least about 200° C. or at least about 250° C., and exposure of the sol to the hotplate may cause at least some of the solvent to be driven off or vaporized. In some cases, however, the sol-gel reaction may proceed even in the absence of heat, e.g., at room temperature. Thus, for instance, the sol may be left alone for a while (e.g., about an hour, about a day, etc.), and/or air or other gases, or liquids, may be passed over the sol, to allow the sol-gel reaction to proceed.

In other embodiments, other techniques of initiation may be used instead of or in addition to photoinitiators. Examples include, but are not limited to, redox initiation, thermal decomposition triggered by e.g. heating portions of a device (e.g., this can be done by liquid streams that have a certain temperature or contain an oxidizing or a reducing chemical). In another embodiment, functionalization of the surfaces may be achieved by polyaddition and polycondensation reactions, for instance, if the surface contains reactive groups that can participate in the reaction. Silanes containing a desired functionality may also be added in some cases, e.g., silanes containing COOH moieties, $NH_2$ moieties, $SO_3H$ moieties, $SO_4H$ moieties, OH moieties, PEG-chains, or the like).

In some cases, any ungelled sol that is still present may be removed from the substrate. The ungelled sol may be actively removed, e.g., physically, by the application of pressure or the addition of a compound to the substrate, etc., or the ungelled sol may be removed passively in some cases. For instance, in some embodiments, a sol present within a microfluidic channel may be heated to vaporize solvent, which builds up in a gaseous state within the microfluidic channels, thereby increasing pressure within the microfluidic channels. The pressure, in some cases, may be enough to cause at least some of the ungelled sol to be removed or "blown" out of the microfluidic channels.

In certain embodiments, the sol is pretreated to cause partial condensation to occur, prior to exposure to the substrate. For instance, the sol may be treated such that partial condensation occurs within the sol. The sol may be treated, for example, by exposing the sol to an acid or a base, or to temperatures that are sufficient to cause at least some gellation to occur. In some cases, the temperature may be less than the temperature the sol will be exposed to when added to the substrate. Some condensation of the sol may occur, but the condensation may be stopped before reaching completion, for instance, by reducing the temperature. Thus, within the sol, some oligomers or other complex structures (e.g., branched structures or spherical structures) may form (which may not necessarily be well-characterized in terms of length), although full condensation has not yet occurred. The partially treated sol may then be added to the substrate, as discussed above.

In certain embodiments, a portion of the coating may be treated to alter its hydrophobicity (or other properties) after the coating has been introduced to the substrate. In some cases, the coating is exposed to a solution containing a monomer and/or an oligomer, which is then condensed or polymerized to bond to the coating, as discussed above. For instance, a portion of the coating may be exposed to heat or to light such as ultraviolet right, which may be used to initiate a free radical polymerization reaction to cause polymerization to occur. Optionally, a photoinitiator may be present, e.g., within the sol-gel coating, to facilitate this reaction. In some embodiments, the photoinitiator may also contain double bonds, thiols, and/or other reactive groups such that the monomers and/or oligomers can be covalently linked to the sol-gel coating.

As discussed, in some aspects of the invention, a microfluidic channel may be coated in a sol-gel material. "Microfluidic," as used herein, refers to a device, apparatus or system including at least one fluid channel having a cross-sectional dimension of less than about 1 millimeter (mm), and in some cases, a ratio of length to largest cross-sectional dimension of at least 3:1. One or more conduits of the system may be a capillary tube. In some cases, multiple conduits are provided, and in some embodiments, at least some are nested, as described herein. The conduits may be in the microfluidic size range and may have, for example, average inner diameters, or portions having an inner diameter, of less than about 1 millimeter, less than about 300 micrometers, less than about 100 micrometers, less than about 30 micrometers, less than about 10 micrometers, less than about 3 micrometers, or less than about 1 micrometer, thereby providing droplets having comparable average diameters. One or more of the conduits may (but not necessarily), in cross section, have a height that is substantially the same as a width at the same point. Conduits may include an orifice that may be smaller, larger, or the same size as the average diameter of the conduit. For example, conduit orifices may have diameters of less than about 1 mm, less than about 500 micrometers, less than about 300 micrometers, less than about 200 micrometers, less than about 100 micrometers, less than about 50 micrometers, less than about 30 micrometers, less than about 20 micrometers, less than about 10 micrometers, less than about 3 micrometers, etc. In cross-section, the conduits may be rectangular or substantially non-rectangular, such as circular or elliptical.

A "channel," as used herein, means a feature on or in an article (substrate) that at least partially directs flow of a fluid. The channel can have any cross-sectional shape (circular, oval, triangular, irregular, square or rectangular, or the like) and can be covered or uncovered. In embodiments where it is completely covered, at least one portion of the channel can have a cross-section that is completely enclosed, or the entire channel may be completely enclosed along its entire length with the exception of its inlet(s) and/or outlet(s). A channel may also have an aspect ratio (length to average cross sectional dimension) of at least 2:1, more typically at least 3:1, 5:1, 10:1, 15:1, 20:1, or more. An open channel generally will include characteristics that facilitate control over fluid transport, e.g., structural characteristics (an elongated indentation) and/or physical or chemical characteristics (hydrophobicity vs. hydrophilicity) or other characteristics that can exert a force (e.g., a containing force) on a fluid. The fluid within the channel may partially or completely fill the channel. In some cases where an open channel is used, the fluid may be held within the channel, for example, using surface tension (i.e., a concave or convex meniscus).

The channel may be of any size, for example, having a largest dimension perpendicular to fluid flow of less than about 5 mm or 2 mm, or less than about 1 mm, or less than about 500 microns, less than about 200 microns, less than about 100 microns, less than about 60 microns, less than about 50 microns, less than about 40 microns, less than about 30 microns, less than about 25 microns, less than about 10 microns, less than about 3 microns, less than about 1 micron, less than about 300 nm, less than about 100 nm, less than about 30 nm, or less than about 10 nm. In some cases the dimensions of the channel may be chosen such that fluid is able to freely flow through the article or substrate. The dimensions of the channel may also be chosen, for example, to allow a certain volumetric or linear flowrate of fluid in the channel. Of course, the number of channels and the shape of the channels can be varied by any method known to those of ordinary skill in the art. In some cases, more than one channel or capillary may be used. For example, two or more channels may be used, where they are positioned inside each other, positioned adjacent to each other, positioned to intersect with each other, etc.

In some cases, relatively large numbers of devices may be used in parallel, for example at least about 10 devices, at least about 30 devices, at least about 50 devices, at least about 75 devices, at least about 100 devices, at least about 200 devices, at least about 300 devices, at least about 500 devices, at least about 750 devices, or at least about 1,000 devices or more may be operated in parallel. The devices may comprise different conduits (e.g., concentric conduits), orifices, microfluidics, etc. In some cases, an array of such devices may be formed by stacking the devices horizontally and/or vertically. The devices may be commonly controlled, or separately controlled, and can be provided with common or separate sources of various fluids, depending on the application.

In some cases, such coating techniques may be useful in the creation of multiple emulsions, such as those described in International Patent Application No. PCT/US2006/007772, filed Mar. 3, 2006, entitled "Method and Apparatus for Forming Multiple Emulsions," by Weitz, et al., published as WO 2006/096571 on Sep. 14, 2006; U.S. Provisional Patent Application Ser. No. 60/920,574, filed Mar. 28, 2007, entitled "Multiple Emulsions and Techniques for Formation," by Chu, et al., in U.S. patent application Ser. No. 12/058,628, filed on Mar. 28, 2008, entitled "Emulsions and Techniques for Formation," by Chu, et al., or in a International Patent Application Serial No. PCT/US2008/004097, filed on Mar. 28, 2008, entitled "Emulsions and Techniques for Formation," by Chu, et al., each incorporated herein by reference. For instance, in one set of embodiments, to create a multiple emulsion, an inner droplet may created using a first droplet maker and an outer droplet may be created using a second droplet maker. Optionally, this may be extended to a third droplet maker, a fourth droplet maker, etc. The droplet makers may be constructed such that they exhibit different hydrophobicities. In one embodiment, coating techniques such as those described herein are used to control the hydrophobicities. For example, a first droplet maker may be coated such that it is more hydrophobic than a second droplet maker (or vice versa). A non-limiting example of such a system is described in the Examples, below.

A variety of materials and methods, according to certain aspects of the invention, can be used to form systems such as those described above. In some cases, the various materials selected lend themselves to various methods. For example, various components of the invention can be formed from solid materials, in which the channels can be formed via micromachining, film deposition processes such as spin coating and chemical vapor deposition, laser fabrication, photolithographic techniques, etching methods including wet chemical or plasma processes, and the like. See, for example, *Scientific American*, 248:44-55, 1983 (Angell, et al.). In one embodiment, at least a portion of the fluidic system is formed of silicon by etching features in a silicon chip. Technologies for precise and efficient fabrication of various fluidic systems and devices of the invention from silicon are known. In another embodiment, various components of the systems and devices of the invention can be formed of a polymer, for example, an elastomeric polymer such as polydimethylsiloxane ("PDMS"), polytetrafluoroethylene ("PTFE" or Teflon®), or the like.

Different components can be fabricated of different materials. For example, a base portion including a bottom wall and side walls can be fabricated from an opaque material such as silicon or PDMS, and a top portion can be fabricated from a transparent or at least partially transparent material, such as glass or a transparent polymer, for observation and/or control of the fluidic process. In other embodiments, however, the components need not be transparent or partially transparent, depending on the application. Components can be coated so as to expose a desired chemical functionality to fluids that contact interior channel walls, where the base supporting material does not have a precise, desired functionality. For example, components can be fabricated as illustrated, with interior channel walls coated with another material. Material used to fabricate various components of the systems and devices of the invention, e.g., materials used to coat interior walls of fluid channels, may desirably be selected from among those materials that will not adversely affect or be affected by fluid flowing through the fluidic system, e.g., material(s) that is chemically inert in the presence of fluids to be used within the device.

In one embodiment, various components of the invention are fabricated from polymeric and/or flexible and/or elastomeric materials, and can be conveniently formed of a hardenable fluid, facilitating fabrication via molding (e.g. replica molding, injection molding, cast molding, etc.). The hardenable fluid can be essentially any fluid that can be induced to solidify, or that spontaneously solidifies, into a solid capable of containing and/or transporting fluids contemplated for use in and with the fluidic network. In one embodiment, the hardenable fluid comprises a polymeric liquid or a liquid polymeric precursor (i.e. a "prepolymer"). Suitable polymeric liquids can include, for example, thermoplastic polymers, thermoset polymers, or mixture of such polymers heated above their melting point. As another example, a suitable polymeric liquid may include a solution of one or more polymers in a suitable solvent, which solution forms a solid polymeric material upon removal of the solvent, for example, by evaporation. Such polymeric materials, which can be solidified from, for example, a melt state or by solvent evaporation, are well known to those of ordinary skill in the art. A variety of polymeric materials, many of which are elastomeric, are suitable, and are also suitable for forming molds or mold masters, for embodiments where one or both of the mold masters is composed of an elastomeric material. A non-limiting list of examples of such polymers includes polymers of the general classes of silicone polymers, epoxy polymers, and acrylate polymers. Epoxy polymers are characterized by the presence of a three-membered cyclic ether group commonly referred to as an epoxy group, 1,2-epoxide, or oxirane. For example, diglycidyl ethers of bisphenol A can be used, in addition to compounds based on aromatic amine, triazine, and cycloaliphatic backbones. Another example includes the well-known Novolac polymers. Non-limiting examples of silicone elastomers suitable for use according to the invention include those formed from precursors including the chlorosilanes such as methylchlorosilanes, ethylchlorosilanes, phenylchlorosilanes, etc.

Silicone polymers are preferred in one set of embodiments, for example, the silicone elastomer polydimethylsiloxane. Non-limiting examples of PDMS polymers include those sold under the trademark Sylgard by Dow Chemical Co., Midland, Mich., and particularly Sylgard 182, Sylgard 184, and Sylgard 186. Silicone polymers including PDMS have several beneficial properties simplifying fabrication of the microfluidic structures of the invention. For instance, such materials are inexpensive, readily available, and can be solidified from a prepolymeric liquid via curing with heat. For example, PDMSs are typically curable by exposure of the prepolymeric liquid to temperatures of about, for example, about 65° C. to about 75° C. for exposure times of, for example, about an hour. Also, silicone polymers, such as PDMS, can be elastomeric, and thus may be useful for forming very small features with relatively high aspect ratios, necessary in certain embodiments of the invention. Flexible (e.g., elastomeric) molds or masters can be advantageous in this regard. Another example of suitable polymers are polyhydroxyalkanoates such as poly(3-hydroxybutyrate-co-3-hydroxyhexanoate).

One advantage of forming structures such as microfluidic structures of the invention from silicone polymers, such as PDMS, is the ability of such polymers to be oxidized, for example by exposure to an oxygen-containing plasma such as an air plasma, so that the oxidized structures contain, at their surface, chemical groups capable of cross-linking to other oxidized silicone polymer surfaces or to the oxidized surfaces of a variety of other polymeric and non-polymeric materials. Thus, components can be fabricated and then oxidized and essentially irreversibly sealed to other silicone polymer surfaces, or to the surfaces of other substrates reactive with the oxidized silicone polymer surfaces, without the need for separate adhesives or other sealing means. In most cases, sealing can be completed simply by contacting an oxidized silicone surface to another surface without the need to apply auxiliary pressure to form the seal. That is, the pre-oxidized silicone surface acts as a contact adhesive against suitable mating surfaces. Specifically, in addition to being irreversibly sealable to itself, oxidized silicone such as oxidized PDMS can also be sealed irreversibly to a range of oxidized materials other than itself including, for example, glass, silicon, silicon oxide, quartz, silicon nitride, polyethylene, polystyrene, glassy carbon, and epoxy polymers, which have been oxidized in a similar fashion to the PDMS surface (for example, via exposure to an oxygen-containing plasma). Oxidation and sealing methods useful in the context of the present invention, as well as overall molding techniques, are described in the art, for example, in an article entitled "Rapid Prototyping of Microfluidic Systems and Polydimethylsiloxane," *Anal. Chem.*, 70:474-480, 1998 (Duffy, et al.), incorporated herein by reference.

In some embodiments, certain microfluidic structures of the invention (or interior, fluid-contacting surfaces) may be formed from certain oxidized silicone polymers. Such surfaces may be more hydrophilic than the surface of an elastomeric polymer. Such hydrophilic channel surfaces can thus be more easily filled and wetted with aqueous solutions. Such surfaces may be useful for sol-gel coatings.

In one embodiment, a bottom wall of a microfluidic device of the invention is formed of a material different from one or more side walls or a top wall, or other components. For example, the interior surface of a bottom wall can comprise the surface of a silicon wafer or microchip, or other substrate. Other components can, as described above, be sealed to such alternative substrates. Where it is desired to seal a component comprising a silicone polymer (e.g. PDMS) to a substrate (bottom wall) of different material, the substrate may be selected from the group of materials to which oxidized silicone polymer is able to irreversibly seal (e.g., glass, silicon, silicon oxide, quartz, silicon nitride, polyethylene, polystyrene, epoxy polymers, and glassy carbon surfaces which have been oxidized). Alternatively, other sealing techniques can be used, as would be apparent to those of ordinary skill in the art, including, but not limited to, the use of separate adhesives, bonding, solvent bonding, ultrasonic welding, etc.

The following applications are each incorporated herein by reference: U.S. patent application Ser. No. 08/131,841, filed Oct. 4, 1993, entitled "Formation of Microstamped Patterns on Surfaces and Derivative Articles," by Kumar, et al., now U.S. Pat. No. 5,512,131, issued Apr. 30, 1996; U.S. patent application Ser. No. 09/004,583, filed Jan. 8, 1998, entitled "Method of Forming Articles including Waveguides via Capillary Micromolding and Microtransfer Molding," by Kim, et al., now U.S. Pat. No. 6,355,198, issued Mar. 12, 2002; International Patent Application No. PCT/US96/03073, filed Mar. 1, 1996, entitled "Microcontact Printing on Surfaces and Derivative Articles," by Whitesides, et al., published as WO 96/29629 on Jun. 26, 1996; International Patent Application No.: PCT/US01/16973, filed May 25, 2001, entitled "Microfluidic Systems including Three-Dimensionally Arrayed Channel Networks," by Anderson, et al., published as WO 01/89787 on Nov. 29, 2001; U.S. patent application Ser. No. 11/246,911, filed Oct. 7, 2005, entitled "Formation and Control of Fluidic Species," by Link, et al., published as U.S. Patent Application Publication No. 2006/0163385 on Jul. 27, 2006; U.S. patent application Ser. No. 11/024,228, filed Dec. 28, 2004, entitled "Method and Apparatus for Fluid Dispersion," by Stone, et al., published as U.S. Patent Application Publication No. 2005/0172476 on Aug. 11, 2005; International Patent Application No. PCT/US2006/007772, filed Mar. 3, 2006, entitled "Method and Apparatus for Forming Multiple Emulsions," by Weitz, et al., published as WO 2006/096571 on Sep. 14, 2006; U.S. patent application Ser. No. 11/360,845, filed Feb. 23, 2006, entitled "Electronic Control of Fluidic Species," by Link, et al., published as U.S. Patent Application Publication No. 2007/000342 on Jan. 4, 2007; and U.S. patent application Ser. No. 11/368,263, filed Mar. 3, 2006, entitled "Systems and Methods of Forming Particles," by Garstecki, et al. Also incorporated herein by reference are U.S. Provisional Patent Application Ser. No. 60/920,574, filed Mar. 28, 2007, entitled "Multiple Emulsions and Techniques for Formation," by Chu, et al., U.S. Patent Application Ser. No. 60/920,574, filed on Mar. 28, 2007, entitled "Emulsions and Techniques for Formation," by Chu, et al., International Patent Application Serial No. PCT/US2008/004097, filed on Mar. 28, 2007, entitled "Emulsions and Techniques for Formation," by Chu, et al., and U.S. Provisional Patent Application Ser. No. 61/040,442, filed Mar. 28, 2008, entitled "Surfaces, Including Microfluidic Channels, With Controlled Wetting Properties," by Abate, et al.

The following examples are intended to illustrate certain embodiments of the present invention, but do not exemplify the full scope of the invention.

EXAMPLE 1

This example illustrates a system that combines the simplicity of stamped polydimethylsiloxane (PDMS) devices with the chemical robustness and precision control of the interface of glass. This example uses sol-gel chemistry to coat PDMS channels with a photoactive, chemically resistant sol-gel layer. In addition, this example shows that with the incorporation of functional compounds into the coating, the properties of the coated interface can be precisely engineered. By incorporating fluorosilanes into the coating, a hydrophobic interface can be produced, suitable for the formation of inverted water-in-oil emulsions. By incorporating a photoactive silane into the coating, the coated interface can be spatially modified through UV graft-polymerization. This allows simple production of microfluidic devices having sharp contrasts in wetting, which can be use to produce multiple emulsions, such as those described in a U.S. Patent Application filed on even date herewith, entitled "Emulsions and Techniques for Formation," by Chu, et al.

The photoactive sol-gel coating in this example contains a photoiniator coupled to a silane that is embedded in the sol-gel network. To make this molecule, combined are 11.0 g Irgacure 2959, 0.01 g hydroquinone, and 49.4 microliters dibutyltin dilaurate in 20.0 mL of dry chloroform. This was stirred under nitrogen until the mixture is homogeneous, and slowly added was 12.1 mL silane-isocyanate over 30 min. The mixture was then stirred for 3 hours at 50° C. to allow the reaction to complete. During this time, the primary alcohol of the Irgacure is belived to participates in nucleophilic addition with the isocyanate group, forming a urethane bond. The reaction was performed in a dry environment to reduce the possibility side reactions. This yielded a pure product, which was verified by thin layer chromatography (TLC). To concentrate the reaction product, the chloroform is removed under vacuum, yielding a yellowish solid which was used without further purification.

To prepare the photoactive sol precursor mixture, combined were 1 mL TEOS (tetraethyl orthosilicate), 1 mL MTES (methyltriethoxy silane), 0.5 mL heptadecafluorosilane, 0.5 g Irgacure-silane, 1 mL trifluoroethanol, and 1 mL pH 2 $H_2O$ adjusted with hydrochloric acid. The solution was heated on a 200° C. hotplate for 5 min until it turned clear. The acid catalyzed condensation and the hydrolysis reactions of the alkoxy silanes. The hydrolysis reactions also cleaved ethoxy groups from the silanes, converting them into hydroxyl groups. The silane monomers were couple with one another through hydrolysis and condensation to yield higher molecular weight compounds. The resulting oligmer precursors were miscible with PDMS, preventing swelling. In addition, the preconversion also reduced contraction and cracking during gelation, yielding more homogeneous coatings.

The PDMS channels were treated with oxygen plasma to generate silanol groups just before they were sealed by bonding to a glass slide. The bonded device was then immediately flushed with the preconverted photoactive sol mixture. The preconverted siloxanes reacted with the hydroxyl groups on the PDMS and the glass to form covalent silica bonds. To initiate the gelation reaction, the devices were placed on a 250° C. hotplate with the bottom glass slide in contact with the hotplate. The high temperature initiated gelation while vaporizing the solvent. This caused pressure to build in the channels, which blew them clear and left behind the desired coating.

The thickness of the coating increased with the viscosity of the sol-mixture and decreased with the temperature of the hotplate. For instance, thicker coatings may be appropriate for larger channels in which higher chemical resistance is desired. To deposit a thicker coating, more highly preconverted viscous sol mixtures and lower hotplate temperatures (e.g., around 150° C.) may be used. Thinner coatings could also be applied to channels with features smaller than 10 micrometers without clogging. To deposit thinner coatings, the viscosity of the sol mixture could be lowered, for instance, by diluting with an equal part or greater of methanol, which has a lower vaporization temperature, and the hotplate temperature could be increased (e.g., to 250° C.).

The photoiniatior in the coating allowed spatial functionanlization of the channels through UV graft polymerization. A monomer solution was prepared by combining 0.2 mL of acrylic acid with 0.8 mL 5 M $NaIO_4$ $H_2O$, 1 mL ethanol, 0.5 mL acetone and 0.05 g benzophenone. The $NaIO_4$ and benzopehone were added in this case to speed polymerization. The device was then filled with the monomer solution and irradiated with UV light wherever polymerization was desired. The UV light generated radicals by cleaving the photoinitiator molecules, initiating polymerization. The growing acrylic acid polymers were tethered to the sol-gel network through covalent linkages with the initiator-silanes and through cross-linkages with one another through the benzophenone; the benzophenone also abstracts hydrogen from methyl groups in the coating, which may increase interfacial bonding. The thickness of the polymerized layer depended on the intensity and duration of the UV exposure, affording additional control over the wetting change of the interface.

To achieve micrometer scale UV pattern resolution, a demagnified image of the field diaphragm of a Koehler Illumination path was projected onto the sample. UV-transparent fused silica lenses were used to ensure UV transmission to the sample. A liquid-fiber mercury arc-lamp was used for illumantion. The size of the illuminated field, and therefore, the size of the polymerized region, can be controlled by dialing the field diaphragm. The intensity of the illuminated field, and therefore, the rate at which polymerization progresses, could be adjusted by dialing the condenser diaphragm. Moreover, various patterned photomasks could be placed at the field diagram to project a more sophisticated pattern. The channels here were irradiated for 1-5 min, depending on their dimensions and the desired thickness of the polymer layer, and these conditions may be optimized using no more than routine skill, depending on the particular application. For instance, smaller channels coated with a thin sol-gel layer required longer irradiation times than large channels coated with a thick sol-gel layer.

Figure 1F:
Figure 1C:
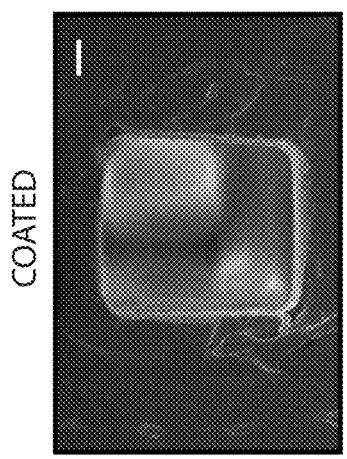
Figure 1D:
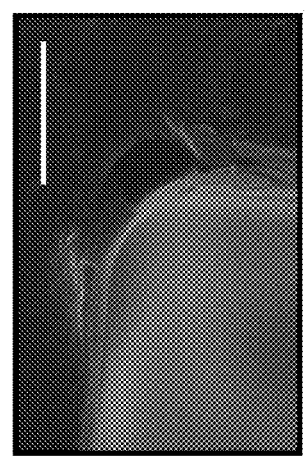
Figure 1A:
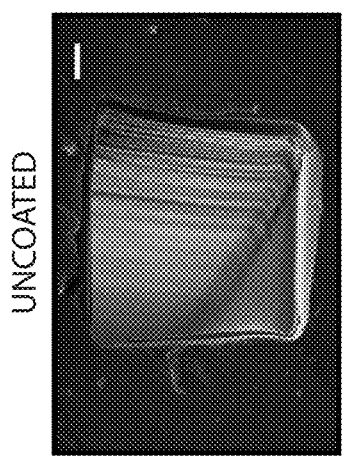
Figure 1B:
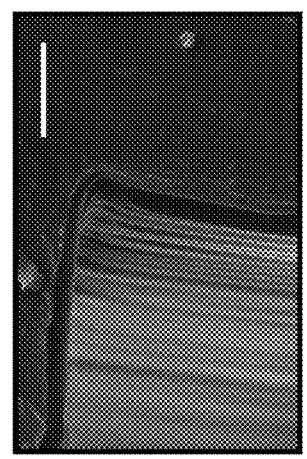

To directly observe the coating, scanning electron micrograph (SEM) images of channel cross-sections were captured. FIG. 1 illustrates SEM images of channel cross sections prepared as discussed above. The PDMS channels were coated with a thin layer of sol-gel using a low viscosity sol mixture and a 250° C. hotplate temperature. The uncoated PDMS channels were initially rectangular in shape, exhibiting clean PDMS walls, as shown in FIGS. 1A-1B. However, the delicate wavy pattern of the initial PDMS side walls, which is an artifact of the soft-lithography process, were smoothed over by the sol-gel coating, as shown by the coated channel cross-section in FIG. 1C. The corners of the coated channels were also rounded-off because the coating liquid wetted channels and collected in the corners, as shown in FIG. 1D. A region of the coated device was functionalized with acrylic acid using UV graft polymerization. The grafted polymer was deposited as a thin layer on the surface of the sol-gel, as shown in FIG. 1E. The grafted polymer was covalently linked to the sol-gel through bonds with the photoactive silane. As the polymer layer grew, a pattern developed on the channel walls, as shown in FIG. 1F. The images in FIGS. 1B, 1D, and 1F show higher magnification images upper-right corner of each of the cross-sections of FIGS. 1A, 1C, and 1E, respectively. All scale bars denote 5 micrometers.

Figure 2A:
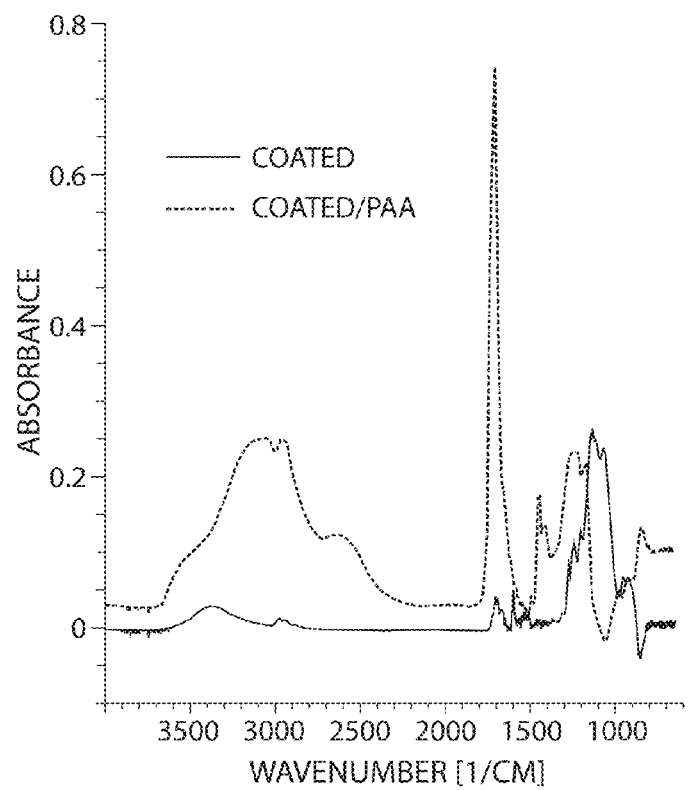
FIGS. 2A-2C illustrate FTIR and contact angle measurements of a coated substrate, in another embodiment of the invention.

To verify that the grafted polymer was permanently deposited onto the sol-gel interface, fourier transform infrared spectroscopy (FTIR) measurements were performed on coated and polyacrylic acid grafted substrates. FTIR allows the identification of the proportion of chemical groups in the coating before and after polymerization. Before grafting, the FTIR spectrum of the coating showed a peak at the wavenumber 1670 and 1700, as shown in FIG. 2A. These peaks corresponded to the carbonyl groups of the urethane linkage in the photoactive silane. After polymerization, the peak at 1700 increased in amplitude and broadened due to the addition of a large number of carbonyl groups in the polyacrylic acid grafted to the surface, as shown in FIG. 2A.

Figure 2B:
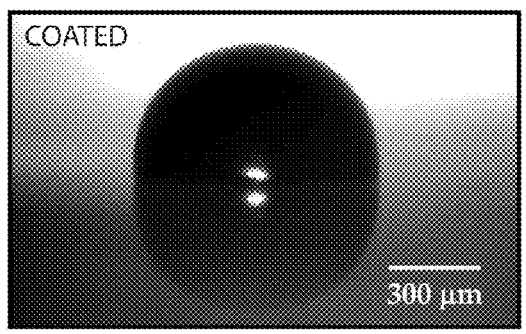
Figure 2C:
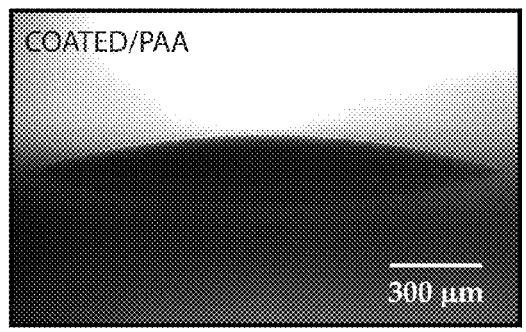

To determine the functional wetting properties of the coating before and after grafting, contact angle measurements were performed with water droplets. A glass slide was coated with the photoactive sol-gel and half of of the slide was functionalized with polyacrylic acid. A water droplet was placed on each half of the slide and images were captured to measure the contact angle. The native coating was hydrophobic due to the addition of fluorosilane to the coating mixture; thus, the water droplet beaded-up, forming a contact angle of about 106°, as shown in FIG. 2A. Such a contact angle is consistent with that of a fluorinated surface, and may be used for the production of inverted water-in-fluorocarbon oil emulsions in a coated microfluidic device. By contrast, the water droplet spread out in the polyacrylic acid grafted half of the slide, forming a contact angle of about 5°, as shown in FIG. 2B. Such a hydrophilic device may be used for the production of direct oil-in-water emulsions in a coated, PAA grafted microfluidic device.

To characterize the surface topography of the coating, atomic force microscopy (AFM) images were captured of both coated and coated/grafted microchannels. The native coating was smooth and showed little structure in the AFM images, as shown in FIG. 3A. By contrast, the portion of the channel on which polyacrylic acid had been grafted showed a rich topographical structure, as shown in FIG. 3B. The images show a 5×10 micrometer area; dark to light colour scale maps to 0 to 150 nm high feature sizes. In fact, when polymerization is viewed with a brightfield microscope, ridged reptilations can be seen to gradually develop in the grafted region. The amplitude of the reptilations increased with the amount of polymer that was grafted to the interface.

To quantify the resolution with which the polymer can be grafted, a spatially modified channel was stained with toluidene blue, a dye that electrostatically binds to polyacrylic acid. The channels were filled with 0.1% by weight aqueous dye solution and allowed to sit for 1 min. The solution was then flushed out with 1 mL of $H_2O$. A brightfield image of the spatially grafted and stained channel is shown in FIG. 3C; the PDMS channel has been coated and, on the right, PAA grafted. The polyacrylic acid has been stained with Toluidene Blue. To quantify spatial precision of the grafting, the average intensity across the channel was computed and plotted as a function of channel length, as shown in in FIG. 3D. From the intensity profile the reptilations are seen to have a characteristic wavelength of about 2-3 micrometers for this particular device. The contrast between the coated and grafted regions was also estimated to be about 5 micrometers, as shown by the region demarcated in gray in FIG. 3D.

EXAMPLE 2

Figure 4A:
FIGS. 4A-4D illustrate the production of multiple emulsions, in one embodiment of the invention.

The coating discussed in Example 1 can allow PDMS channels to be modified so as to have sharp contrasts in wetting. This may be useful for a number of applications, including inversion of an emulsion and the formation of multiple emulsions, and/or to prevent adsorption or fouling from occurring. As a demonstration, in this example, multiple emulsions were produced in coated, spatially grafted PDMS devices. For the emulsions, water and fluorocarbon oil (Fluorinert FC40) stabilized by surfactants Zonyl FSN-100 (Sigma-Aldrich) and Krytox 157FSL (Dupont) were used. For a double emulsion, a device having two flow-focus dropmakers arranged in series, as shown in FIG. 4A, was coated. The bare coating was hydrophobic due to the high concentration of fluorosilane in the sol-gel network; thus, after coating, the first drop-maker produced an inverted water-in-oil emulsion, as shown in FIG. 4A. By contrast, after graft-polymerization of polyacrylic acid the second drop-maker is made hydrophilic; this allowed emulsification of the oil continuous phase of the first drop-maker for the production of water-in-oil-in-water double emulsions, as shown in FIG. 4A. The scale bars in FIG. 4 is 60 micrometers.

Figure 4B:
Figure 4C:
Figure 4D:

To produce triple emulsions, a third stage of droplet making was concatenated onto the device, and the second drop-maker was functionalized to make it hydrophilic; the native wetting properties of the coating made the other dropmaker stages hydrophobic. Using only FC40, $H_2O$ and surfactant for all phases, W/O/W/O triple emulsions of various morphologies were produced, as shown in FIGS. 4B-4D. The morphology of the multiple emulsion depended on the flow rates of the injected phases and the geometry of the dropmaker stages. In particular, in this particular example, the greatest control over droplet morphology was obtained when the height of the device is fixed equal to the width of the smallest dropmaker, and the width of the subsequent dropmakers were gradually scaled-up.

The chemistry of the sol-gel mixture can be engineered to control the inherent wetting properties of the coating; this allows production of emulsions without further functionalization. The wetting properties of the coated channels could be spatially modified through UV graft polymerization; this produced chemically resistant channels with sharp contrasts in wetting, which can be used to produce multiple emulsions, or in other suitable applications.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article, comprising:
   a sol-gel coating comprising a photoinitiator coated on at least a portion of a microfluidic channel,
   wherein a first portion of the sol-gel coating is relatively hydrophobic, and a second portion of the sol-gel coating is relatively hydrophilic.

2. The article of claim 1, wherein the microfluidic channel is defined within a microfluidic device comprising polydimethylsiloxane.

3. The article of claim 1, wherein the microfluidic channel is defined within a microfluidic device comprising glass.

4. The article of claim 1, wherein the coating comprises a silane.

5. The article of claim 1, wherein the coating comprises a fluorosilane.

6. The article of claim 1, wherein the coating comprises a moiety comprising a thiol.

7. The article of claim 1, wherein the photoinitiator is Irgacure 2959.

8. The article of claim 1, wherein the sol-gel coating has a thickness of no more than about 10 micrometers.

9. The article of claim 1, wherein at least a portion of the sol-gel coating comprises acrylic acid.

10. A method, comprising:
    exposing at least a portion of a microfluidic channel to a sol;
    causing at least a portion of the sol to gel within the microfluidic channel to form a sol-gel coating comprising a photoinitiator; and
    altering the hydrophobicity of a first portion of the sol-gel coating without altering the hydrophobicity of a second portion of the sol-gel coating.

11. The method of claim 10, wherein causing at least a portion of the sol to gel comprises heating the sol.

12. The method of claim 10, wherein causing at least a portion of the sol to gel within the microfluidic channel to form a sol-gel coating comprises leaving the sol undisturbed for a time of at least about an hour.

13. The method of claim 10, wherein causing at least a portion of the sol to gel comprises vaporizing the solvent within the sol.

14. The method of claim 10, wherein altering the hydrophobicity of the first portion of the sol-gel coating comprises exposing the first portion to a solution comprising a monomer.

15. The method of claim 14, further comprising causing at least a portion of the monomer to polymerize to the sol-gel coating, thereby altering the hydrophobicity of the first portion of the sol-gel coating.

16. The method of claim 10, wherein altering the hydrophobicity of the first portion of the sol-gel coating comprises exposing at least a portion of the sol-gel to ultraviolet light.

17. The method of claim 10, further comprising reacting at least a portion of the microfluidic channel to produce silanols.

18. The method of claim 17, wherein reacting at least a portion of the microfluidic channel to produce silanols comprises exposing at least a portion of the microfluidic channel to an oxygen plasma.

19. The method of claim 10, wherein the sol is pretreated by treating the sol in the absence of the microfluidic channel such that some condensation within the sol occurs.

20. The method of claim 19, wherein the sol is pretreated by heating the sol.

21. The article of claim 1, wherein the coating comprises heptadecafluorooctylsilane.

22. The article of claim 1, wherein the coating comprises heptadecafluorosilane.

23. An article, comprising:
    a sol-gel coating at least a portion of which comprises acrylic acid coated on at least a portion of a microfluidic channel,
    wherein a first portion of the sol-gel coating is relatively hydrophobic, and a second portion of the sol-gel coating is relatively hydrophilic.

24. The article of claim 23, wherein the microfluidic channel is defined within a microfluidic device comprising polydimethylsiloxane.

25. The article of claim 23, wherein the microfluidic channel is defined within a microfluidic device comprising glass.

26. The article of claim 23, wherein the coating comprises a silane.

27. The article of claim 23, wherein the coating comprises a fluorosilane.

28. The article of claim 23, wherein the coating comprises a moiety comprising a thiol.

29. The article of claim 23, wherein the sol-gel coating has a thickness of no more than about 10 micrometers.

30. The article of claim 23, wherein the coating comprises heptadecafluorooctylsilane.

31. The article of claim 23, wherein the coating comprises heptadecafluorosilane.

32. The article of claim 23, wherein the acrylic acid is chemically bonded to the sol-gel coating.

33. The article of claim 23, wherein the portion of the sol-gel coating comprising acrylic acid is less hydrophobic than a portion of the sol-gel coating free of acrylic acid.

* * * * *